United States Patent [19]
Burgun et al.

[11] Patent Number: 5,831,866
[45] Date of Patent: Nov. 3, 1998

[54] METHOD AND APPARATUS FOR REMOVING TIMING HAZARDS IN A CIRCUIT DESIGN

[75] Inventors: Luc Burgun, Creteil; Olivier LePape, Paris; Frederic Reblewski, Les Molieres, all of France

[73] Assignee: Mentor Graphics Corporation, Wilsonville, Oreg.

[21] Appl. No.: 980,419

[22] Filed: Nov. 26, 1997

Related U.S. Application Data

[63] Continuation of Ser. No. 655,843, May 31, 1996.

[51] Int. Cl.$^6$ .................................................. G06F 17/50
[52] U.S. Cl. ........................ 364/488; 364/489; 371/22.2; 371/42; 395/500
[58] Field of Search ................................. 364/488, 489, 364/490; 395/500; 371/30, 47.1, 42, 22.2

[56] References Cited

U.S. PATENT DOCUMENTS

| | | | |
|---|---|---|---|
| 5,377,334 | 12/1994 | Boldt et al. ........................... | 395/290 |
| 5,452,239 | 9/1995 | Dai et al. ............................... | 364/578 |
| 5,493,505 | 2/1996 | Banerjee et al. ...................... | 364/488 |
| 5,517,506 | 5/1996 | Underwood et al. ................. | 371/27 |
| 5,583,787 | 12/1996 | Underwood et al. ................. | 364/489 |

OTHER PUBLICATIONS

Subrahmanyam, P. A., et al., "Specification and Synthesis of Mixed–Mode Systems: Experiments in a VHDL Environment", IEEE, 1993, pp. 235–241.

*Primary Examiner*—Kevin J. Teska
*Assistant Examiner*—Thai Phan
*Attorney, Agent, or Firm*—Blakely Sokoloff Taylor & Zafman, LLP

[57] ABSTRACT

A computer system is programmed with logic for automatically removing timing hazards from a circuit design. More specifically, the computer system is programmed with logic for automatically detecting and resolving clock gating as well as clock division timing hazards from the circuit design. In one embodiment, the computer system is further programmed with logic for logically organize timing hazards into levels, after the clock gating timing hazards have been resolved, and then resolving clock division timing hazards recursively. In one adaptation, the computer system is a component of a hardware emulation system.

23 Claims, 18 Drawing Sheets

| Case | $F_{CKn}$ | $F_{Ck}$ | SYNC |
|---|---|---|---|
| 1 | 0 | 0 | 0 |
| 2 | 1 | 0 | CKn |
| 3 | X | 0 | $CKn \cdot F_{CKn}$ |
| 4 | 0 | 1 | Ck |
| 5 | 1 | 1 | 1 |
| 6 | X | 1 | $F_{CKn} + Ck$ |
| 7 | 0 | X | $Ck \cdot F_{Ck}$ |
| 8 | 1 | X | $CKn. + F_{Ck}$ |
| 9 | X | X | $F_{CKn} \cdot CKn + F_{Ck} \cdot Ck$ |

*Figure 8*

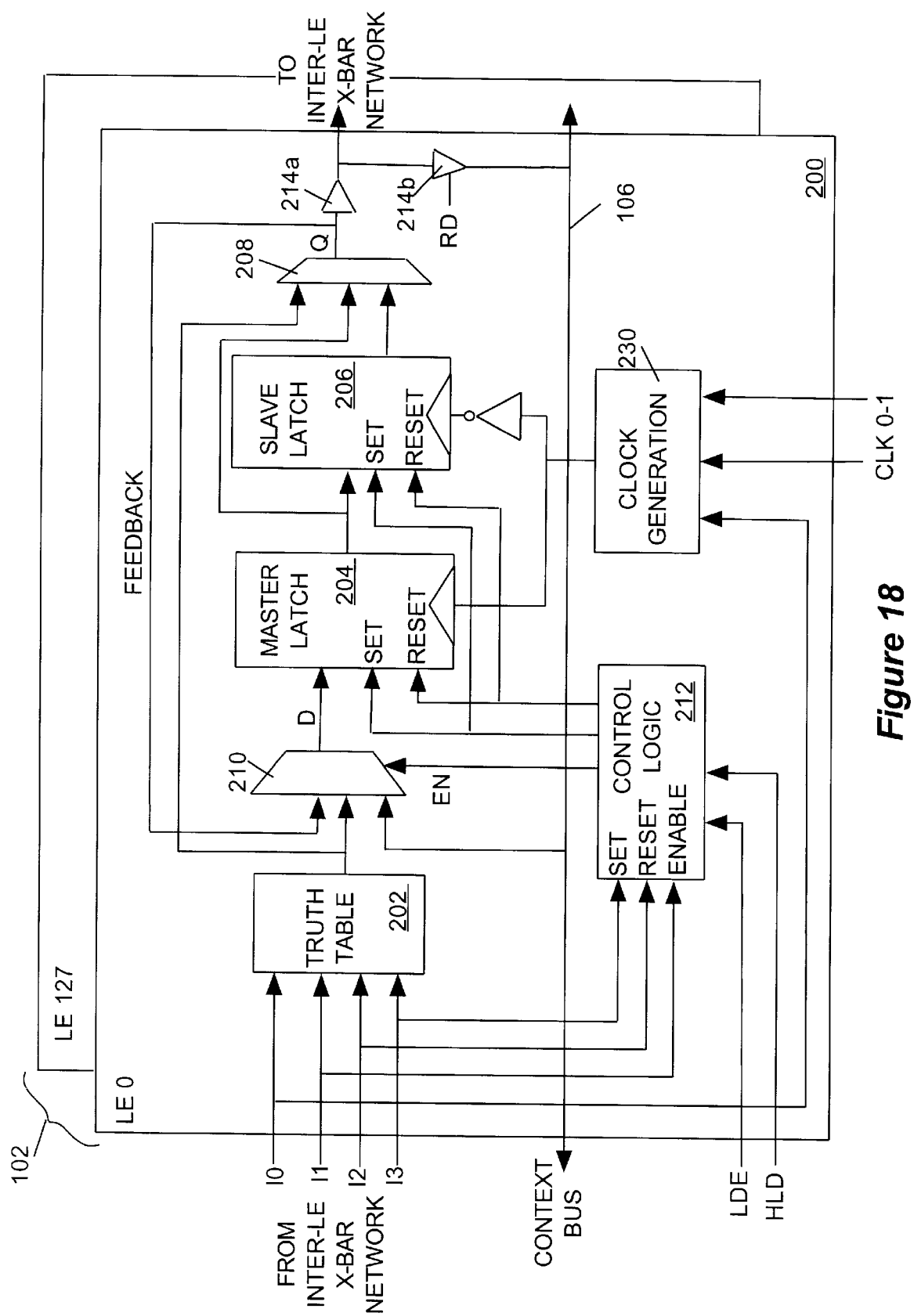

METHOD AND APPARATUS FOR REMOVING TIMING HAZARDS IN A CIRCUIT DESIGN

This is a continuation of application Ser. No. 08/655,843, filed May 31, 1996.

BACKGROUND OF THE INVENTION

1. Field of the Invention

The present invention relates to the field of circuit designs. More specifically, the present invention relates to the art of dealing with timing hazards in a circuit design.

2. Background Information

In certain circuit designs, e.g. synchronous sequential circuits controlled by a periodic clock signal called the master clock, the correct operation these circuits depend on the fact that only transitions by the master clock can cause register outputs to switch. To do so, the clock delay or clock skew (with respect to the master clock) of each and every derived or calculated clock employed to control registers of the circuit must not exceed certain design tolerance limit. Otherwise, various timing hazards such as hold time violations, or race conditions will be encountered. Examples of derived/calculated clocks include gated clocks and divided clocks.

For a large circuit design, it is difficult to ensure the clock delays or clock skews of all derived/calculated clocks will meet the required design tolerance limit. Three techniques are commonly employed to prevent timing hazards:

1) Hand patching of the original design to remove the gated and divided clocks.

2) Timing analysis of potential hold time violations and introduction of additional delays between flip-flops.

3) Pulling of the gated and divided clocks to the source of the clock distribution network.

These techniques suffer a number of drawbacks. The first technique is both time consuming and error prone. The second technique involves recompiling the design and may produce significant transformations in the circuit design, which in turn may result in new potential hold time violations and may lead to a time consuming compilation loop. The last technique is limited by the number of clock nets routed over the clock distribution network.

This problem is especially acute for hardware emulation, which is often employed to validate circuit designs prior to first silicon. Hardware emulation decreases the design development time by allowing a "real-time" verification 10,000 to 1,000,000 times faster than software logic simulation. Thus, hardware emulation has become increasingly popular, as complexity of circuit designs and pressure to reduce time to market continue to increase.

A typical hardware emulation system includes a reconfigurable hardware emulator and circuit design "mapping" software. This "mapping" software includes netlist translation, synthesis, multi-field programmable gate array (FPGA) partitioning, and routing, so that it can automatically produce a configuration file which is downloaded to configure the hardware emulator into a hardware prototype of the design. Unfortunately, all hardware emulators have limitations that constrain their performance. One of the most important problems consists in meeting fundamental timing requirements of the original design, such as the minimal clock skew. Minimal clock skew ensures that a design operates properly by preventing hold time violation due to short paths between registers (latches or edge triggered flip-flops). Existing hardware emulators typically implement a clock distribution network so that every register can be clocked with a minimal clock skew. However, when a clock is gated or divided, the gated/divided clock can no longer be routed over the distribution network. As a result, the minimal clock skew can no longer be guaranteed.

As will be disclosed in more detail below, the present invention provides a new automated approach to remove timing hazards from a circuit design. The invention overcomes the prior art disadvantages, and provides a number of desirable advantages, which will be readily apparent to those skilled in the art. The invention is especially adaptable for use in a hardware emulator.

SUMMARY OF THE INVENTION

A computer system is programmed with logic for automatically removing timing hazards from a circuit design. More specifically, the computer system is programmed with logic for automatically detecting and resolving clock gating as well as clock division timing hazards from the circuit design.

In accordance with one aspect of the present invention, the programmed computer system resolves clock gating timing hazards by transforming each flip-flop controlled by a gated clock into a flip-flop controlled by either the master clock of the circuit design, the inverted master clock, the master clock multiply by two, or a constant logic value. The clocking control is complemented as appropriate by an enable control. The clocking control, the employment of complementary enable control, and if employed, the enable control are determined using a boolean function corresponding to the clock gating circuit elements, and factoring into consideration whether the original flip-flop has an enable input or not. In some cases, depending on the complementary enable control employed, the programmed computer system further inserts an AND gate into the circuit design accordingly, to provide the appropriate complementary enable control.

In accordance with another aspect of the present invention, the programmed computer system resolves clock division timing hazards by transforming each flip-flop controlled by a divided clock into a flip-flop controlled by the "parent" undivided clock and a complementary enable control. The programmed computer system further inserts an AND gate into the circuit design to generate the complementary enable control using an inverted version and a predictive version of the divided clock. The programmed computer system further inserts a replicated copy of the intervening clock dividing elements to generate the predictive version of the divided clock. Lastly, the programmed computer system further inserts a multiplexor for each input providing flip-flop coupled to the intervening clock dividing elements having an enable control, to correctly provide inputs to the replicated intervening clock dividing elements.

In accordance with yet another aspect of the present invention, the computer system is further programmed with logic for logically organize timing hazards into levels, after the clock gating timing hazards have been resolved, and then resolving clock division timing hazards recursively.

In one adaptation, the computer system is a component of a hardware emulation system. The computer system is programmed with the logic for removing timing hazards from a circuit design as an integral part of programming the computer system with logic for compiling and mapping the circuit design onto logic and interconnect elements of the hardware emulation system.

BRIEF DESCRIPTION OF DRAWINGS

The present invention will be described by way of embodiments, but not limitations, illustrated in the accompanying drawings in which like references denote similar elements, and in which:

FIGS. 7, 8, 9a–9i and 10 illustrate one embodiment of the clock gating timing hazard resolution method steps of the present invention;

FIG. 16–18 illustrates one embodiment of the emulator of FIG. 14 in further detail.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system include general purpose as well as special purpose data processing machines, systems, and the like, that are standalone, adjunct or embedded.

Various operations will be described as multiple discrete steps in turn in a manner that is most helpful in understanding the present invention, however, the order of description should not be construed as to imply that these operations are necessarily order dependent, in particular, the order of presentation.

Figure 1:
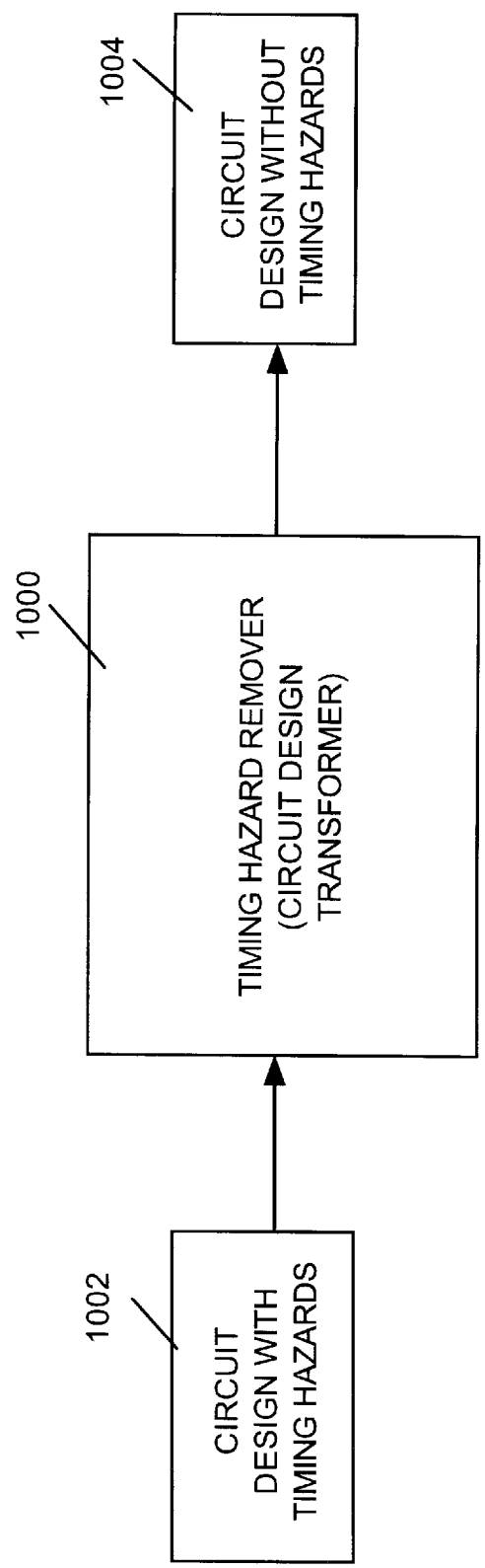
FIG. 1 illustrates an overview of the present invention.

Referring now to FIG. 1, wherein an overview of the present invention is illustrated. Shown is timing hazard remover 1000 of the present invention receiving circuit design 1002 as input, circuit design 1002 having timing hazards, processing the circuit design, automatically detecting and removing the timing hazards from the circuit design, and then outputting circuit design 1004 with timing hazards removed. An example of circuit design 1002 is a synchronous sequential circuit having a number of registers, and controlled by a periodic master clock. Examples of timing hazards include clock gating hazards and clock division hazards, to be more fully described below. Circuit design 1002 may include multiple levels of these timing hazards. Circuit design 1002 may be represented in any one of a number of machine readable manners well known in the art.

In one embodiment, timing hazard remover 1000 is a computer system programmed with logic for automatically removing clock gating and clock division timing hazards from a circuit design. As will be described in more detail below, timing hazard remover 1000 automatically remove timing hazards by transforming the flip-flops in the circuit design. A computer system may be programmed with the logic in a variety of manners known in the art, including but not limited to representing the logic in executable instructions, and storing the executable instruction a storage medium for execution by an execution unit of the computer system during operation. In one adaptation, the computer system is a component of a hardware emulation system, and the logic for removing timing hazards is programmed as an integral part of programming the computer system with logic for compiling and mapping the circuit design onto the logic and interconnect elements of the hardware emulation system.

Before we describe timing hazard remover 1000 in further detail, we will first describe clock gating and clock division timing hazards in more detail, including multi-level timing hazards.

Figure 2A:
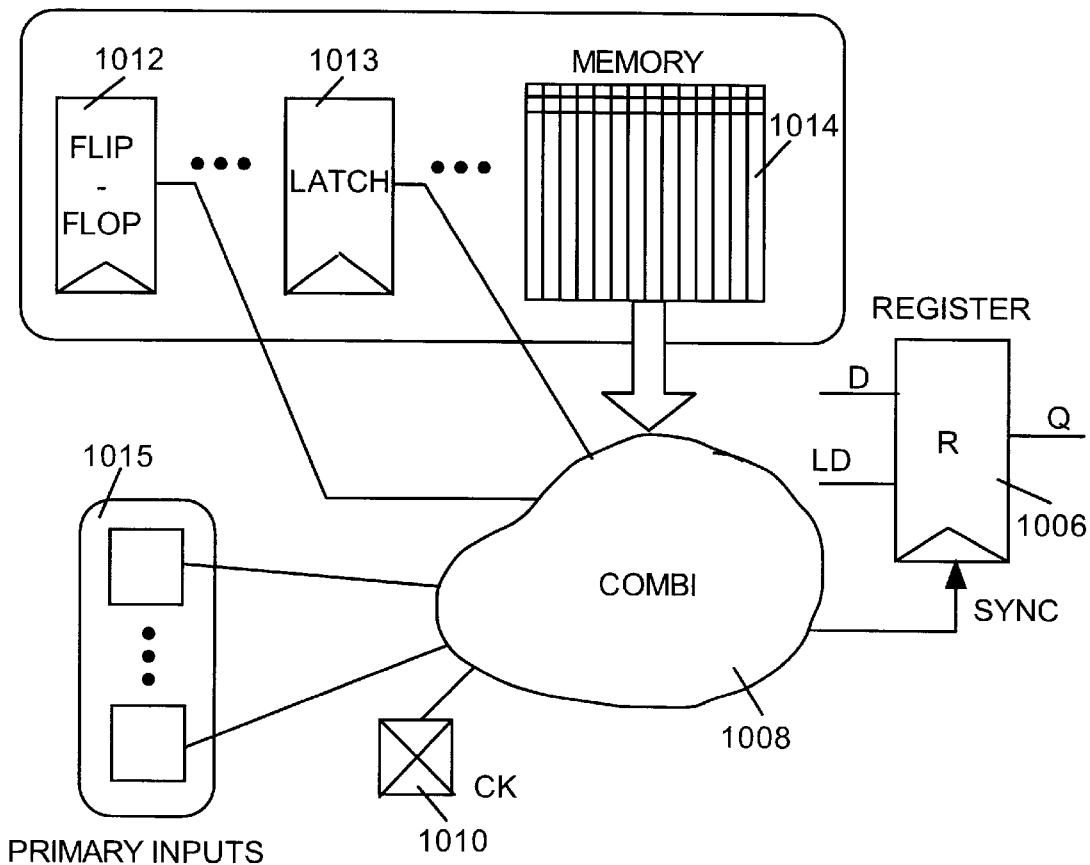
FIGS. 2a–2b illustrate the general case and a simple case of clock gating timing hazards.
Figure 2B:
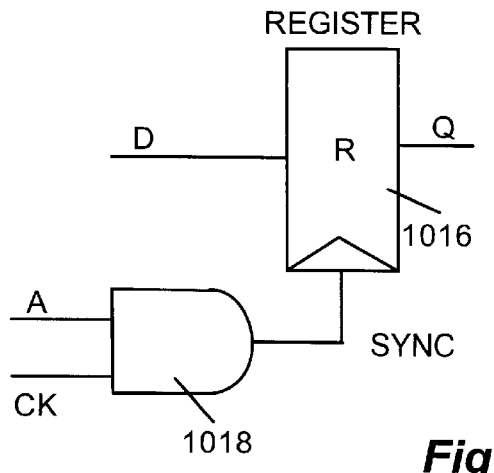

FIGS. 2a–2b illustrate the general case and a simple case of clock gating timing hazard respectively. As shown in FIG. 2a, flip-flop 1006 is clocked by a synchronization SYNC signal (hereinafter simply SYNC signal), which is generated by combinatorial logic 1008 based on a reference master clock CK 1010 (hereinafter simply master clock CK), outputs from other flip-flops 1012, latches 1013, memories 1014 and primary inputs 1015. As a result, the amount of clock delay or clock skew of the SYNC signal (with respect to master clock CK) cannot be guaranteed to be within the design tolerance limit. Obviously, in various variations of this general case, flip-flop 1006 may not have enable control signal LD, combinatorial logic 1008 may be very simple or very complex, combinatorial logic 1008 may use many flip-flop outputs and/or primary inputs, or may use only one of these outputs/inputs in its generation of SYNC. As shown in FIG. 2b, combinatorial logic 1008 may simply be an AND gate 1018, which generates the SYNC signal based only on the master clock CK and one other input A (which could either be a flip-flop output or a primary input).

Figure 3A:
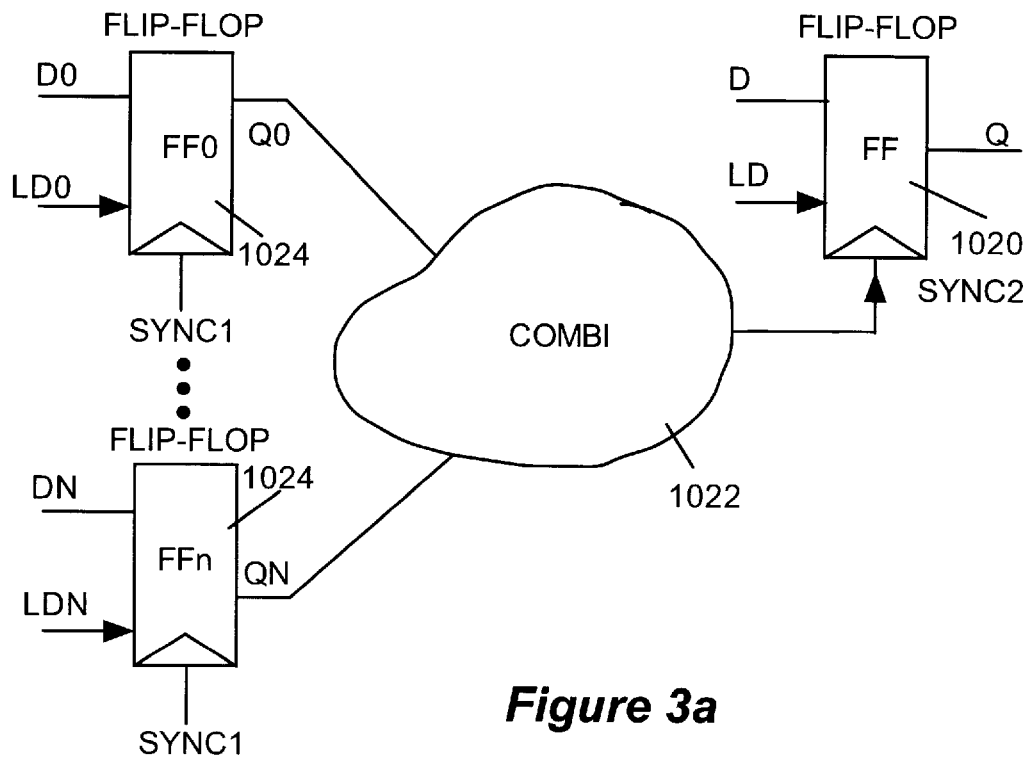
FIGS. 3a–3b illustrate the general case and a simple case of clock dividing timing hazards.
Figure 3B:
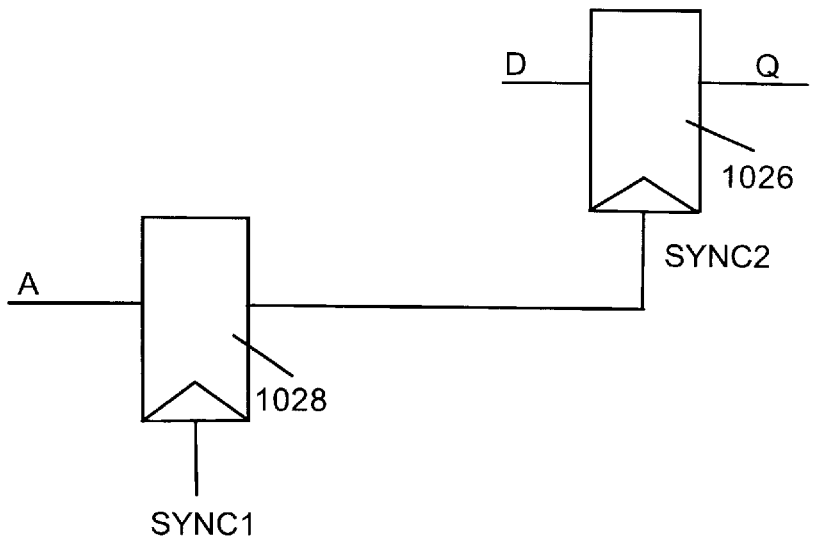

FIGS. 3a–3b illustrate the general case and a simple case of clock division timing hazard respectively. As shown in FIG. 3a, flip-flop 1020 is clocked by a SYNC2 signal, which is generated by combinatorial logic 1022 based on outputs from other flip-flops 1024 clocked by a SYNC1 signal. As a result, even if SYNC1 is the master clock and not a derivative clock, the amount of clock delay or clock skew of the SYNC2 signal (with respect to master clock CK) still cannot be guaranteed to be within the design tolerance limit. Obviously, in various variations of this general case, flip-flops 1020 and 1024 may not have enable control signal LD, LD0–LDn, combinatorial logic 1022 may be very simple or very complex, combinatorial logic 1022 may use many or only one flip-flop output in its generation of SYNC2, and SYNC1 may simply be CK or derived from CK. As shown in FIG. 3b, combinatorial logic 1022 may even be null. In other words, SYNC2 is the output of flip-flop 1028, which is controlled by SYNC1.

Figure 4:
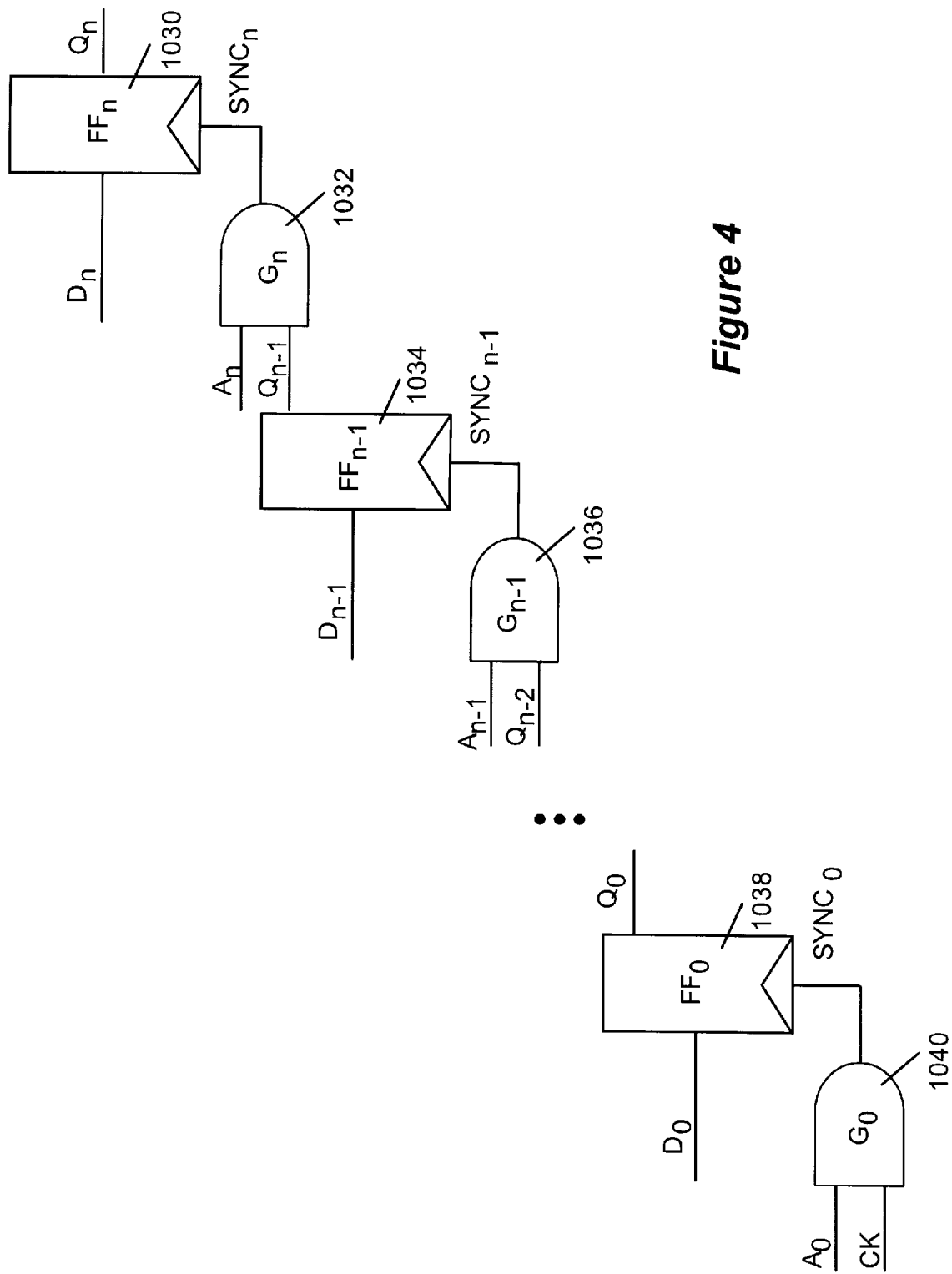
FIG. 4 illustrates an example of multi-level timing hazards.

FIG. 4 illustrates one example of multi-level timing hazards. Flip-flop FFn 1030 is controlled by gated SYNCn signal generated by gate Gn 1032. One of the inputs (Qn-1) employed by gate Gn 1032 is output by another flip-flop FFn-1 1034, which in turn is controlled by another gated SYNCn-1 signal generated by another gate Gn-1 1036. The other input (An) employed by gate Gn 1032 is derived from lower level flip flops synchronized by (ck, SYNC0, ..., SYNCn-1). The pattern continues until ultimately n levels later signal $Q_0$ is output by flip-flop $FF_0$ 1038 controlled by gated $SYNC_0$ signal, which is generated by gate $G_0$ 1038 using the master clock CK as one of its input, and input $A_0$ as the other input. For convenience, we shall refer to the flip-flops clocked by the master clock as flip-flops situated at level 0, the flip-flops clocked by the outputs of the flip-flops of level 0 to be situated at level 1, and so forth. In other words, in general, flip-flops situated at level N+1 are clocked by outputs of flip-flops situated at level N or less than N.

Having now described clock gating and clock division timing hazards, we will now describe timing hazard remover 1000 in more detail.

Figure 5:
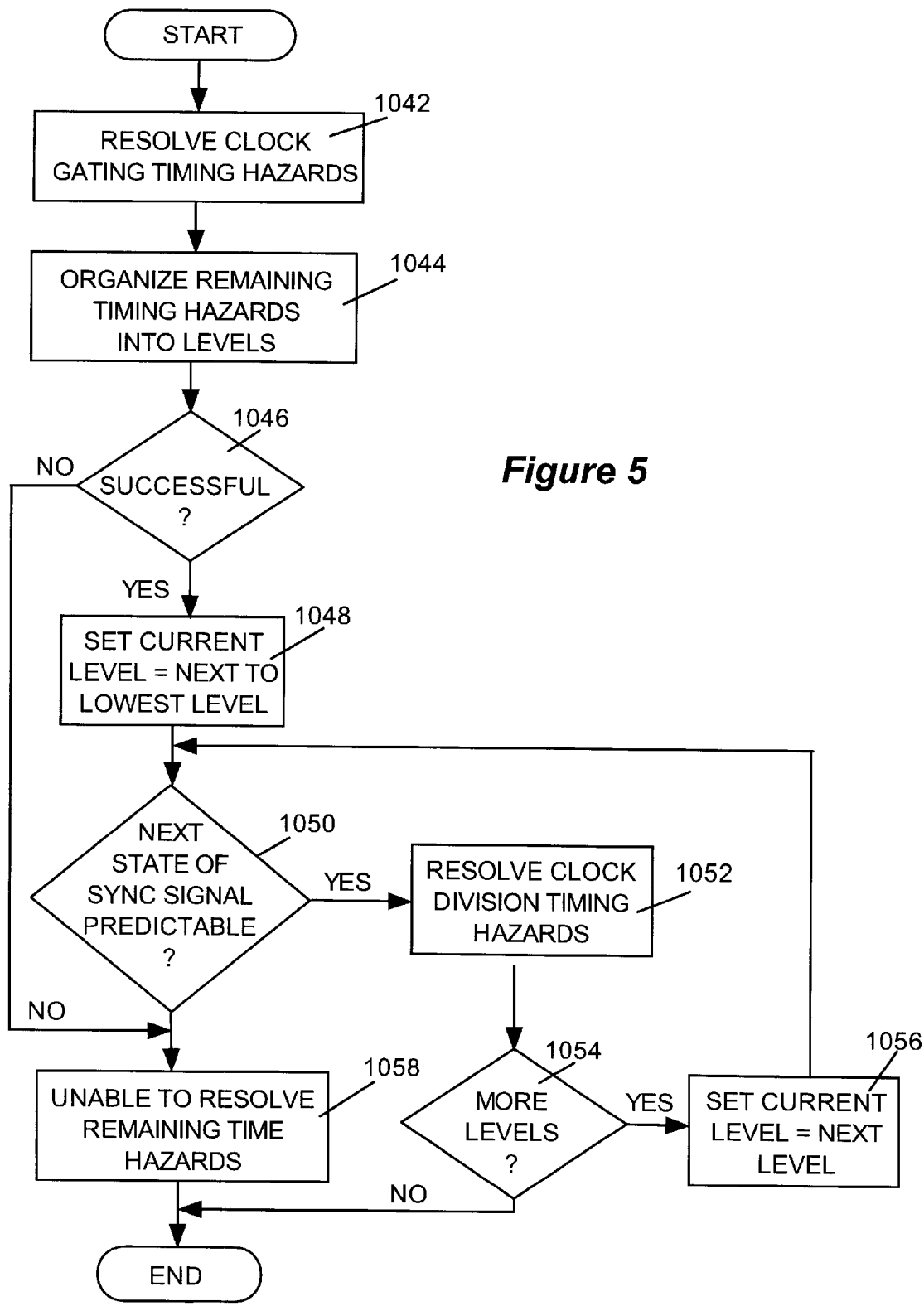
FIG. 5 illustrates one embodiment of the overall method steps of the present invention.

FIG. 5 illustrates the method steps of one embodiment of timing hazard remover 1000. As shown, during operation, timing hazard remover 1000 first resolves clock gating timing hazards in a circuit design, step 1042. Upon resolving all the clock gating timing hazards in the circuit design, which will be described in more detail below, timing hazard remover 1000 logically organize the clock division timing hazards into levels, step 1044. If timing hazard remover 1000 is successful in organizing the clock division timing hazards into levels, step 1048, timing hazard remover 1000 then proceeds to resolve the clock division timing hazards, which will also be described in more detail below, steps 1048–1056. On the other hand, if timing hazard remover 1000 is unable to organizes the clock division timing hazards into levels, it terminates operation, steps 1046 and 1058.

At step 1048, timing hazard remover 1000 sets the current level to the next to lowest level, i.e. the first level of SYNC signals output by flip-flops directly controlled by the master clock. Timing hazard remover 1000 then determines whether the next state of each SYNC signal is predictable, step 1050. If the next state of each SYNC signal is predictable, timing hazard remover 1000 proceeds to resolve the clock division timing hazards, step 1052. On the other hand, if the next state of at least one SYNC signal is not predictable, timing hazard remover 1000 terminates operation, step 1058.

Upon resolving all clock division timing hazards for the current level, timing hazards remover 1000 determines if there are still additional levels of clock division timing hazards to be resolved, step 1054. If the determination is affirmative, timing hazard remover 1000 sets the current level to the next level, step 1056, and repeat steps 1050–1054 again. The process continues until a level having the next state of at least one SYNC signal is not predictable is encountered, step 1050, or until clock division timing hazards have been resolved for all levels, step 1054.

Timing hazard remover 1000 will not be successful in logically organizing the clock division timing hazards into multiple logical levels if a synchronization signal depends on itself. This problem is known to those skilled in the art as a synchronization loop. The next state of a synchronization is unpredictable if an external primary input, a latch output or a memory output is connected to the clock dividing combinatorial logic generating the synchronization signal.

Figure 6A:
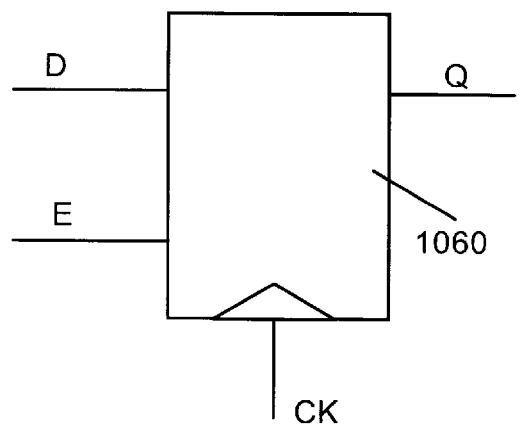
FIG. 6a–6b illustrate the target flip-flop and its equivalent employed to resolve timing hazards in accordance to the present invention.
Figure 6B:
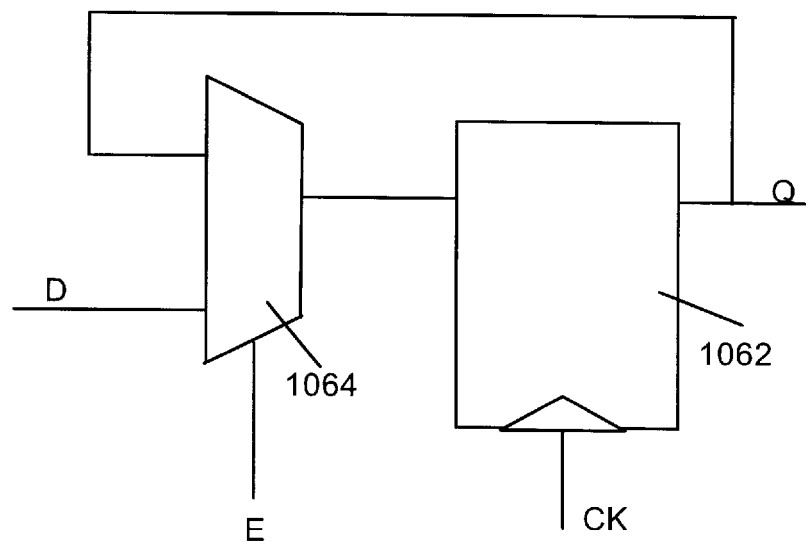

As described earlier, timing hazard remover 1000 resolves clock gating and clock division timing hazards by transforming the flip-flops. More specifically, timing hazard remover 1000 transforms the flip-flops controlled by gated/divided clocks into flip-flops controlled by the master clock and a complementary enable control. Before we proceed to describe these transformation operations in further detail, it should be noted that a flip-flop controlled by a master clock operating in conjunction with a multiplexor controlled by an enable signal may be made functionally equivalent to a flip-flop controlled by a master clock and a complementary enable control. FIG. 6a illustrates a flip-flop 1060 controlled by a clock and a complementary enable control, whereas FIG. 6b illustrates a flip-flop 1062 controlled by a master clock, operating in conjunction with a multiplexor 1064 controlled by an enable signal. As it is apparent to those skilled in art, by providing the D input of flip-flop 1062 with a selected one of either the current state (feedback) or the next state of the D input using multiplexor 1064 as shown, flip-flop 1062 operating in conjunction with multiplexor 1064 is functional equivalent to flip-flop 1060.

Figure 7:
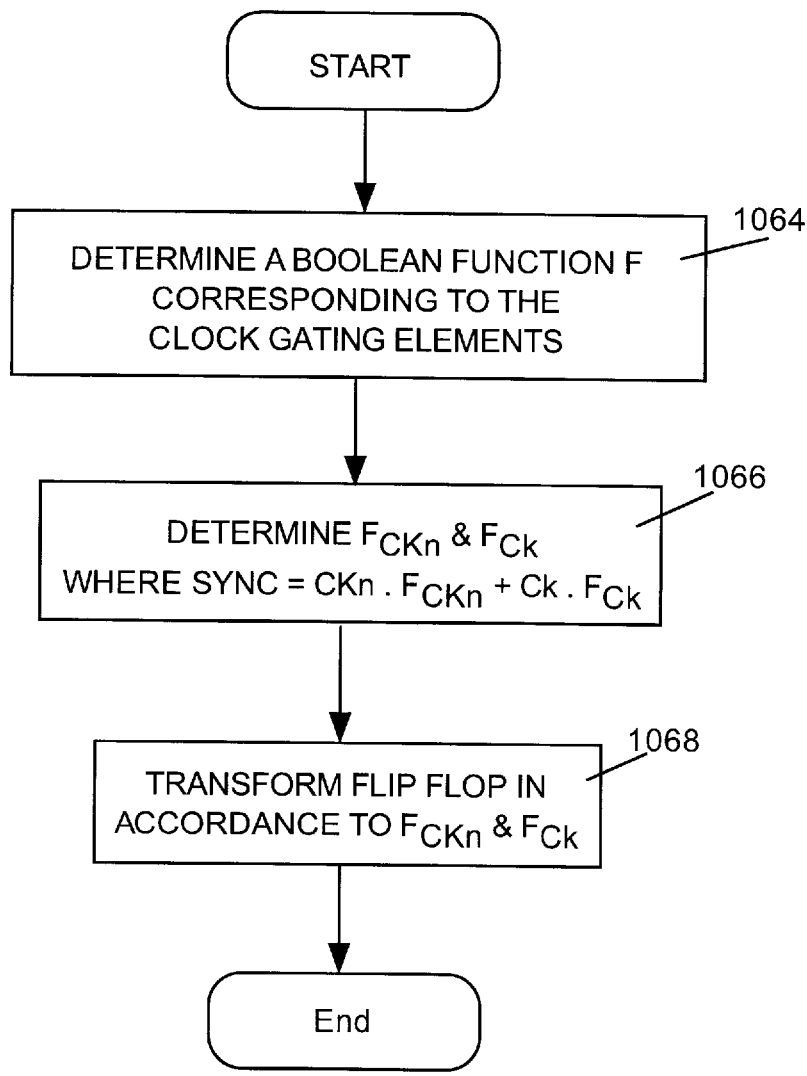

FIG. 7 in conjunction with FIGS. 8 and 9a–9i illustrate the transformation steps performed by one embodiment of timing hazard remover to resolve a clock gating timing hazard. As shown in FIG. 7, timing hazard remover 1000 first determines a boolean function F corresponding to the clock gating elements of the clock gating timing hazard, step 1064. In one embodiment, a canonical representation of F is constructed using the well known Reduced Ordering Binary Decision Diagram (ROBDD). Next, timing hazard remover 1000 determines $F_{ckn}$ and $F_{ck}$, step 1066, where SYNC= $CkN \cdot F_{ckn} + Ck \cdot F_{ck}$, and $F_{ckn}$ and $F_{ck}$ are the cofactors of F with respect to Ck, and equal to F(Ck=0) and F(Ck=1) respectively. (CKN stands for the boolean complement of CK.) The relationship between SYNC, CK, $F_{ckn}$ and $F_{ck}$ is specified by the well known Shannon's formula. Then, timing hazard remover 1000 transforms the flip flop in accordance to the values determined for $F_{ckn}$ and $F_{ck}$, step 1068.

Figure 9A:
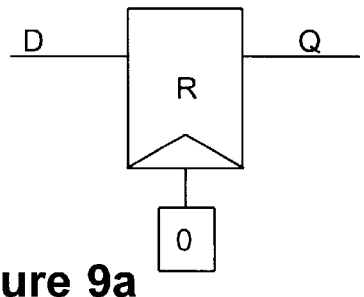
Figure 9B:
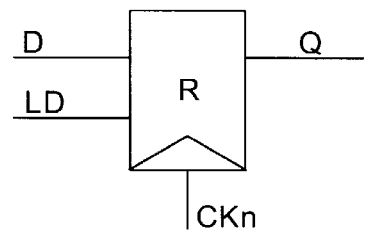
Figure 9C:
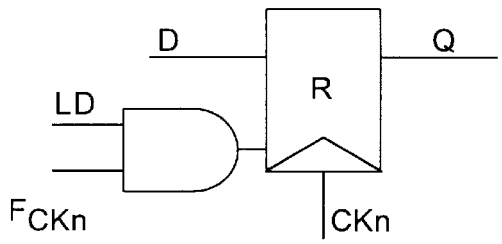
Figure 9D:
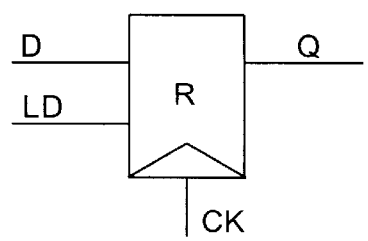
Figure 9E:
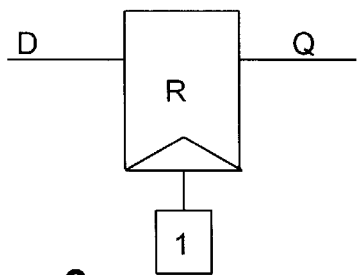
Figure 9F:
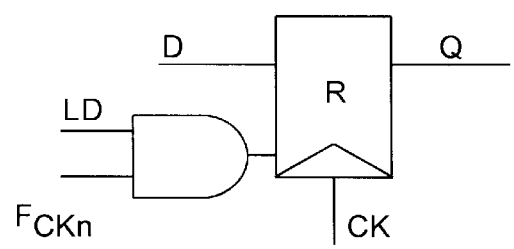
Figure 9G:
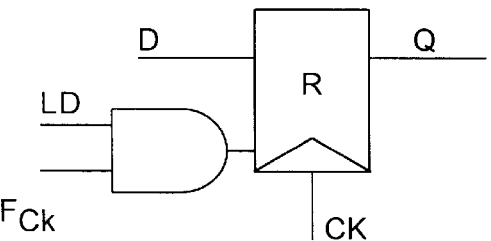
Figure 9H:
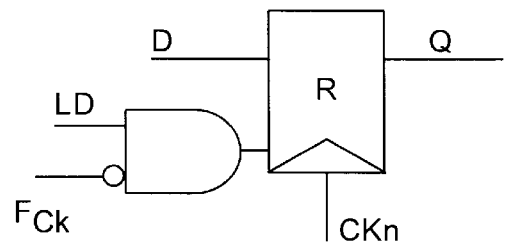
Figure 9I:
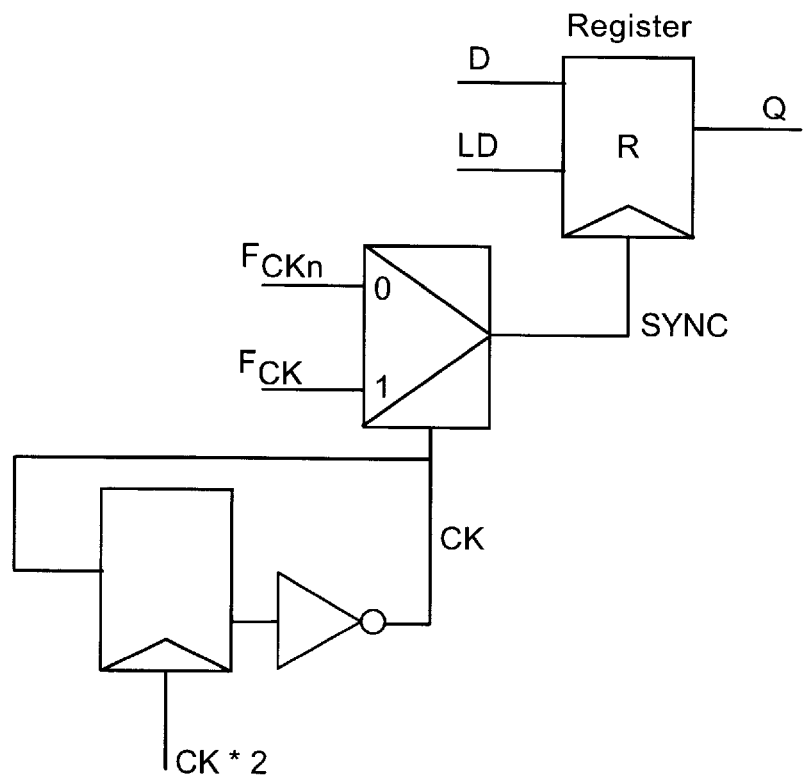

FIG. 8 illustrates the various values $F_{ckn}$ and $F_{ck}$ can take on. There are nine possible pairs of values $\{0, 0\}$, $\{1, 0\}$, $\{X, 0\}$ etc., where X stands for non-constant functions. FIG. 8 also shows the corresponding value for SYNC for each of the nine cases. FIG. 9a–9i illustrate the corresponding transformation performed for each of the nine cases. For example, when $F_{ckn}$ and $F_{ck}$ are determined to be $\{0, 0\}$ (case 1), since SYNC is suppose to always equal to zero, the flip-flop controlled by SYNC is transformed into a flip-flop controlled by the constant logic value zero (without a complementary enable control) (FIG. 9a). When $F_{ckf}$ and $F_{ck}$ are determined to be $\{1, 0\}$ (case 2), since SYNC is suppose to equal to Ck, the flip-flop controlled by SYNC is transformed into a flip-flop controlled by the inverted master clock, which in turn is complemented by the original enable control signal LD only (FIG. 9b). (SYNC is not dependent on either cofactor.) When $F_{ckn}$ and $F_{ck}$ are determined to be $\{X, 0\}$ (case 3), since SYNC is suppose to equal to CkN . $F_{ckn}$, the flip-flop controlled by SYNC is transformed into a flip-flop controlled by the inverted master clock, complemented by an enable control which is $F_{ck}$ qualified by the original enable control LD (FIG. 9c), and so forth. The fact that case one and case five employ the constant logic value zero and one respectively is not a problem, because by virtue of their constancy, there is no excessive clock skew problem, and therefore no potential timing hazards.

The most complicated case is case nine, where $F_{ckn}$ and $F_{ck}$ are determined to be {X, X}. In that case, the clock gating combinatorial logic is replaced by a multiplexor controlled by a divided clock for selecting either $F_{ckn}$ or $F_{ck}$, as SYNC. (LD is unmodified.) The divided clock will have the same frequency as the master clock. The divided clock is derived by introducing a generated clock that is twice as fast as the master clock, and dividing the double frequency clock. The new clock division timing hazard and LD are in turn resolved subsequently with the other clock division timing hazards.

In sum, timing hazard remover 1000 resolves clock gating timing hazards by transforming each flip-flop controlled by a gated clock into a flip-flop controlled by either the master clock of the circuit design, the inverted master clock, the master clock multiple by two, or a constant logic value (0, 1). The clocking control is complemented as appropriate by an enable control. The clocking control, the employment of complementary enable control, and if employed, the enable control are determined using a boolean function corresponding to the clock gating circuit elements, and factoring into consideration whether the original flip-flop has an enable input or not. In some cases, depending on the complementary enable control employed, the programmed computer system further inserts an AND gate into the circuit design accordingly, to provide the appropriate complementary enable control.

Figure 10:
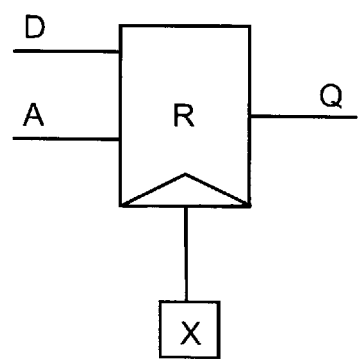

FIG. 10 illustrates the transformed flip-flop for the simple clock gating timing hazard case illustrated in FIG. 2b. Recall from FIG. 2b, the clocking gating combinatorial logic simply includes a single AND gate, thus the corresponding boolean function F is F=A and Ck. Therefore, $F_{ckn}$ and $F_{ck}$ equal 0 and X respectively, i.e. case 7 of FIG. 8. Thus, the original flip-flop clocked by SYNC is transformed into a flip-flop clocked by the master clock Ck, and complemented by $F_{ck}$, which is equal to A (Ck=1). Since the original flip-flop did not have an enable control LD, $F_{ck}$ which is A in the instant example, is provided to the transformed flip-flop without "qualification", therefore resulting in the illustrated flip-flop.

Figure 11:
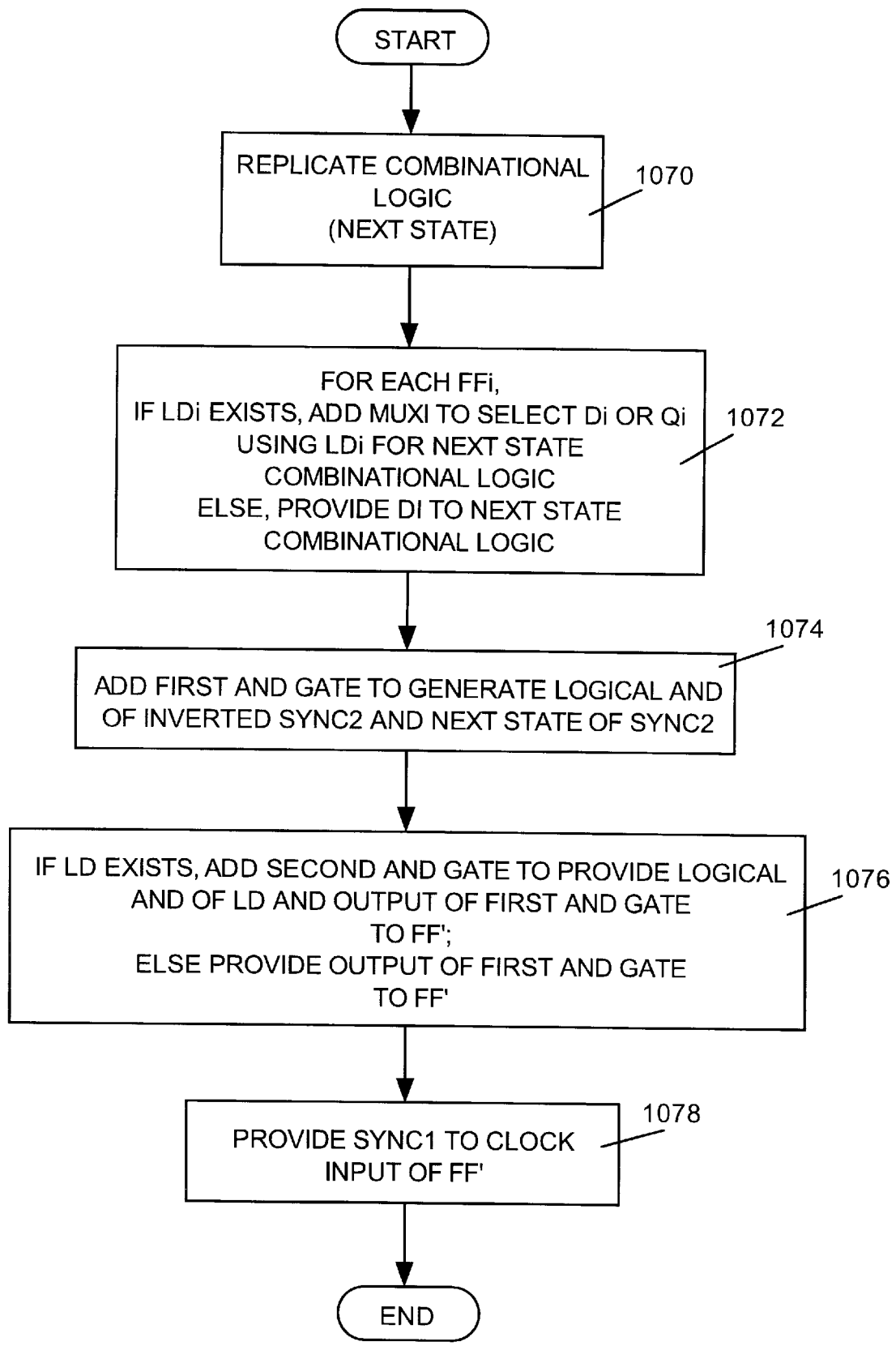
FIGS. 11–13 illustrate one embodiment of the clock division timing hazard resolution method steps of the present invention.
Figure 12:
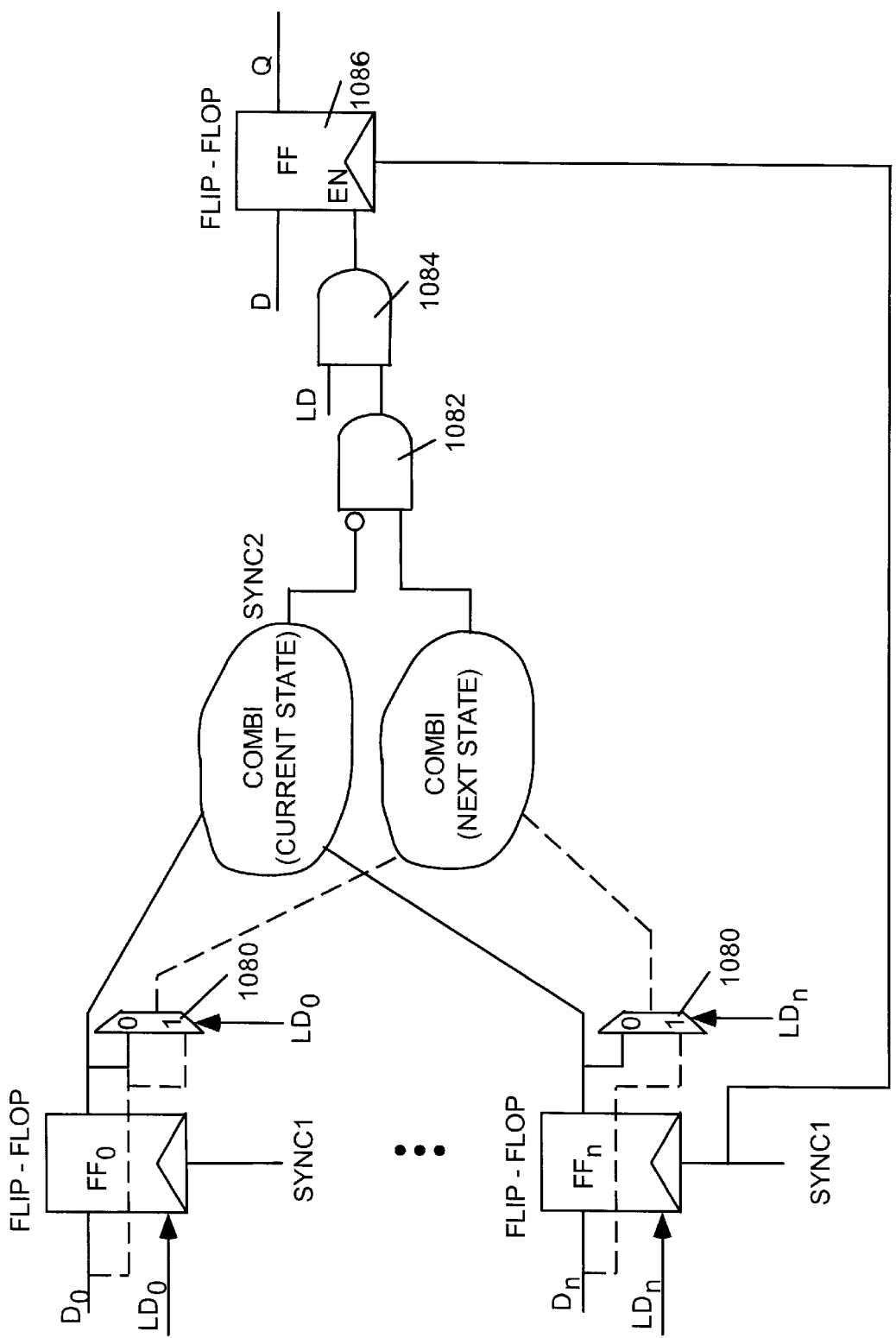

FIGS. 11 in conjunction with FIG. 12 illustrate the transformation steps performed by one embodiment of timing hazard remover to resolve a clock division timing hazard. As shown in FIG. 11, timing hazard remover 1000 first replicates the timing dividing combinatorial logic, step 1070. Next, for each flip-flop that outputs for the clock dividing combinatorial logic, if the outputting flip-flop has an enable control LD, timing hazard remover 1000 inserts a corresponding multiplexor (1080 of FIG. 12) controlled by the original enable control LD to select either the current state (Qi) or the next state (Di) of the outputting flip-flop to output for the replicated clock dividing combinatorial logic; otherwise, timing hazard remover 100 couples the next state (Di) of the outputting flip-flop to output for the replicated clock dividing combinatorial logic, step 1072.

Then, timing hazard remover 1000 inserts a first AND gate (1082 of FIG. 12) to generate a logical AND of inverted SYNC2 and the next state of SYNC2, step 1074. If the original flip-flop has an enable control LD, timing hazard remover 1000 further inserts a second AND gate (1084 of FIG. 12) to qualify the output of first AND gate 1082 for transformed flip-flop (1086 of FIG. 12), otherwise, timing hazard remover 1000 provides the output of first AND gate 1082 to transformed flip-flop 1082 without "qualification". Lastly, timing hazard remover 1000 couples SYNC1 to the clock input transformed flip-fop 1086, step 1078.

In sum, timing hazard remover 1000 resolves clock division timing hazards by transforming each flip-flop controlled by a divided clock into a flip-flop controlled by the "parent" undivided clock and a complementary enable control. Timing hazard remover 1000 further inserts a AND gate into the circuit design to generate the complementary enable control using an inverted version and a predictive version of the divided clock. Timing hazard remover 1000 further inserts a replicated copy of the intervening clock dividing elements to generate the predictive version of the divided clock. Lastly, timing hazard remover 1000 further inserts a multiplexor for each input providing flip-flop coupled to the intervening clock dividing elements having an enable control, to correctly provide inputs to the replicated intervening clock dividing elements.

Figure 13:
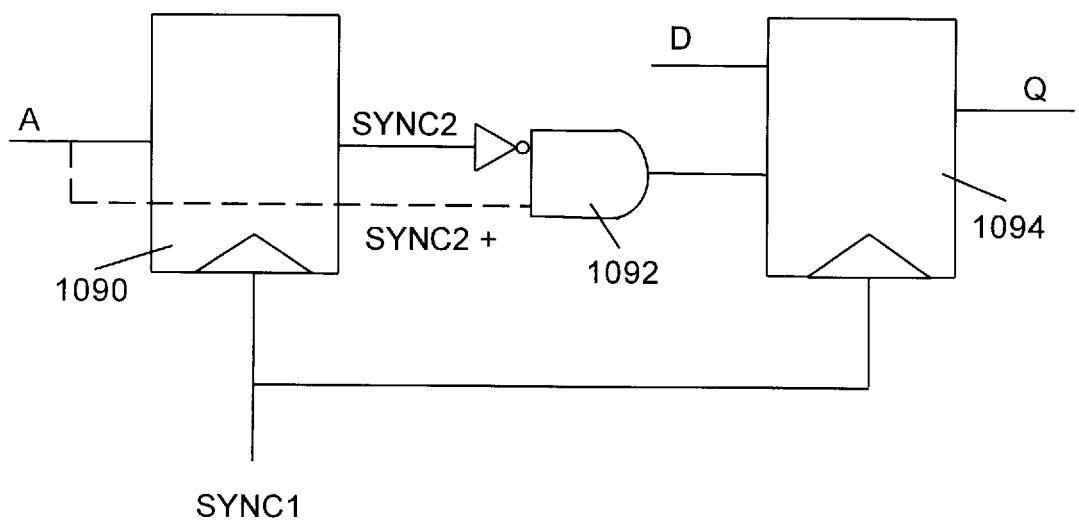

FIG. 13 illustrates the transformed flip-flop for the simple clock dividing timing hazard case illustrated in FIG. 3b. Recall from FIG. 3b, the clock dividing combinatorial logic is null, thus the replicated clock dividing combinatorial logic is also null. Since the outputting flip-flop 1090 did not have an enable control, thus its next state (SYNC2+) is provided directly to the replicated null clock dividing combinatorial logic. Next, AND gate 1092 is provided to generate the logical AND of inverted SYNC2 and SYNC2+. Since the original flip-flop did not have an enable control, the output of AND gate 1092 is provided to transformed flip-flop 1094 as enable control without "qualification". Finally, undivided clock SYNC1 is coupled to the clock input of transformed flip-flop 1094

Having described the timing hazard remover of the present invention in detail, we now proceed to describe a particular adaptation of the present invention in a hardware emulation system, referencing FIGS. 14–18. Obviously, other adaptations are possible, and will be apparent to those skilled in the art.

Figure 14:
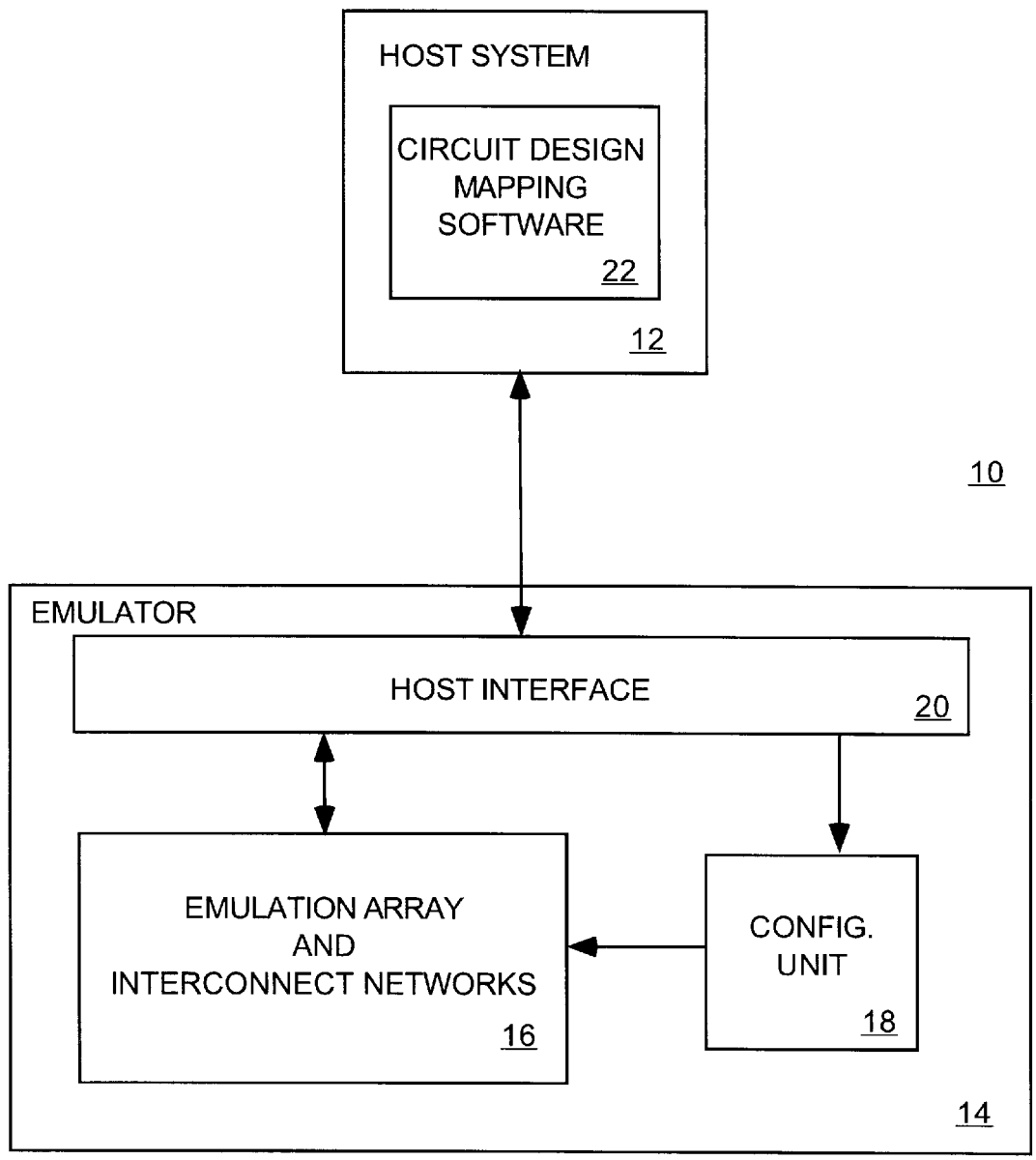
FIG. 14 illustrates a hardware emulation system incorporated with the teachings of the present invention.

FIG. 14 is a block diagram showing the hardware emulation system having the timing hazard remover of the present invention adapted therein. As illustrated, emulation system 10 includes host system 12 and emulator 14. Host system 12 includes in particular circuit design mapping software 22, whereas emulator 14 includes in particular emulation array and interconnect networks 16, a configuration unit 18 and host interface 20 coupled to each other as shown.

Emulation array and interconnect networks 16 performs the conventional function of "realizing" and emulating a circuit design. Circuit design mapping software 22 performs the conventional function of mapping a circuit design onto emulator 14 for emulation, configuring emulator array and interconnect networks 16 through host interface 20 and configration unit 18. However, for the illustrated embodiment, circuit design mapping software 22 incorporates timing hazard remover of the present invention, allowing circuit design a mapping software 22 to automatically remove timing hazards from a circuit design, before compiling and mapping the circuit design onto emulation array and interconnect networks 16. In other words, host system 12 is programmed with logic for resolving timing hazards as an integral part of programming host system 12 with circuit design mapping software 22.

Except for the logic for resolving timing hazards, host system 12 including the base functions of circuit design mapping software 22, and emulator 14, are intended to represent a broad category the respective elements found in conventional emulation systems.

Figure 15:
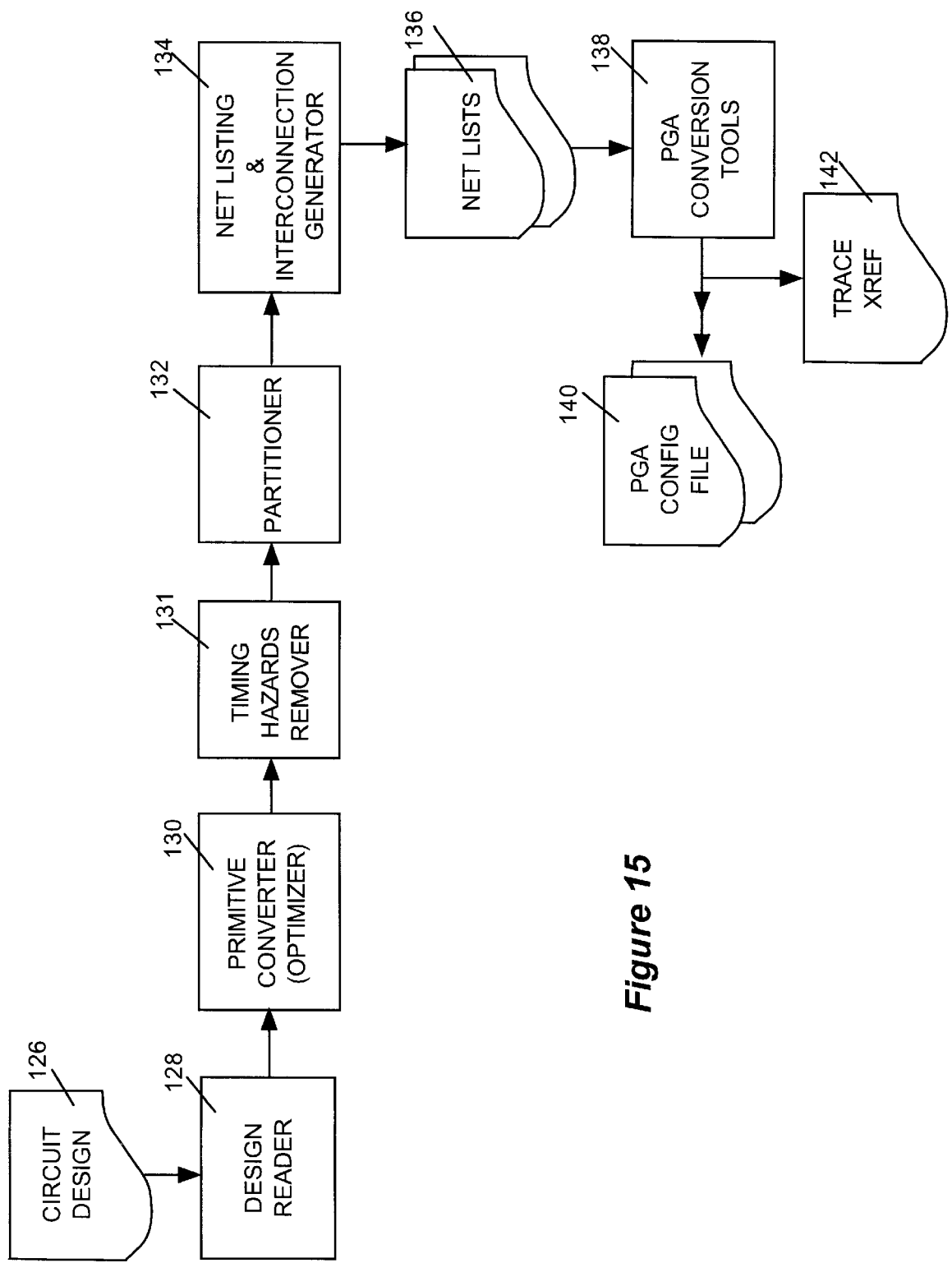
FIG. 15 illustrates one embodiment of the mapping software of FIG. 14 in further detail.

FIG. 15 illustrates circuit design mapping software 22, and the general flow of programming emulation system 10 in further detail. As shown, circuit design mapping software 22 includes design reader 128, primitive converter 130, timing hazard remover 131, partititioner 132, net listing interconnection generator 134 and PGA conversion tool 138. Circuit design 126 is processed by design reader 128, primitive converter 130, timing hazard remover 131, partitioner 132, and netlisting and interconnection generator 134 to generate netlists 136, which in turn is processed by PGA conversion tools 138 to generate PGA configuration files 40 and trace xref files 142. PGA configuration files 140 are then used to configure emulator 14 to "realize" circuit design 126 on emulator 14.

In one embodiment, primitive converter 130 includes an optimizer (not shown) for optimizing the circuit design 126. Most importantly, timing hazard remover 131 automatically resolves clock gating as well as clock division timing hazard in circuit design 126, recursively if there are multiple levels of timing hazards, as described earlier. As a result, when the transformed circuit is "realized" on emulator 14, circuit design 126 can be emulated with the assurance that timing hazards will not be encountered.

Figure 16:
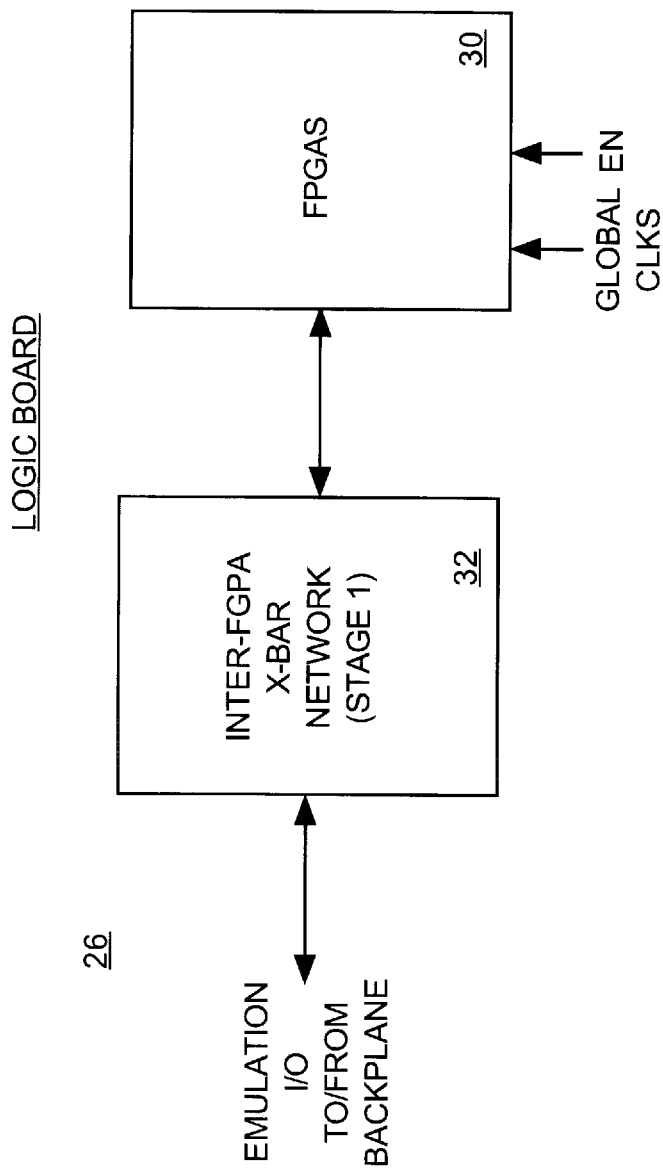
Figure 17:
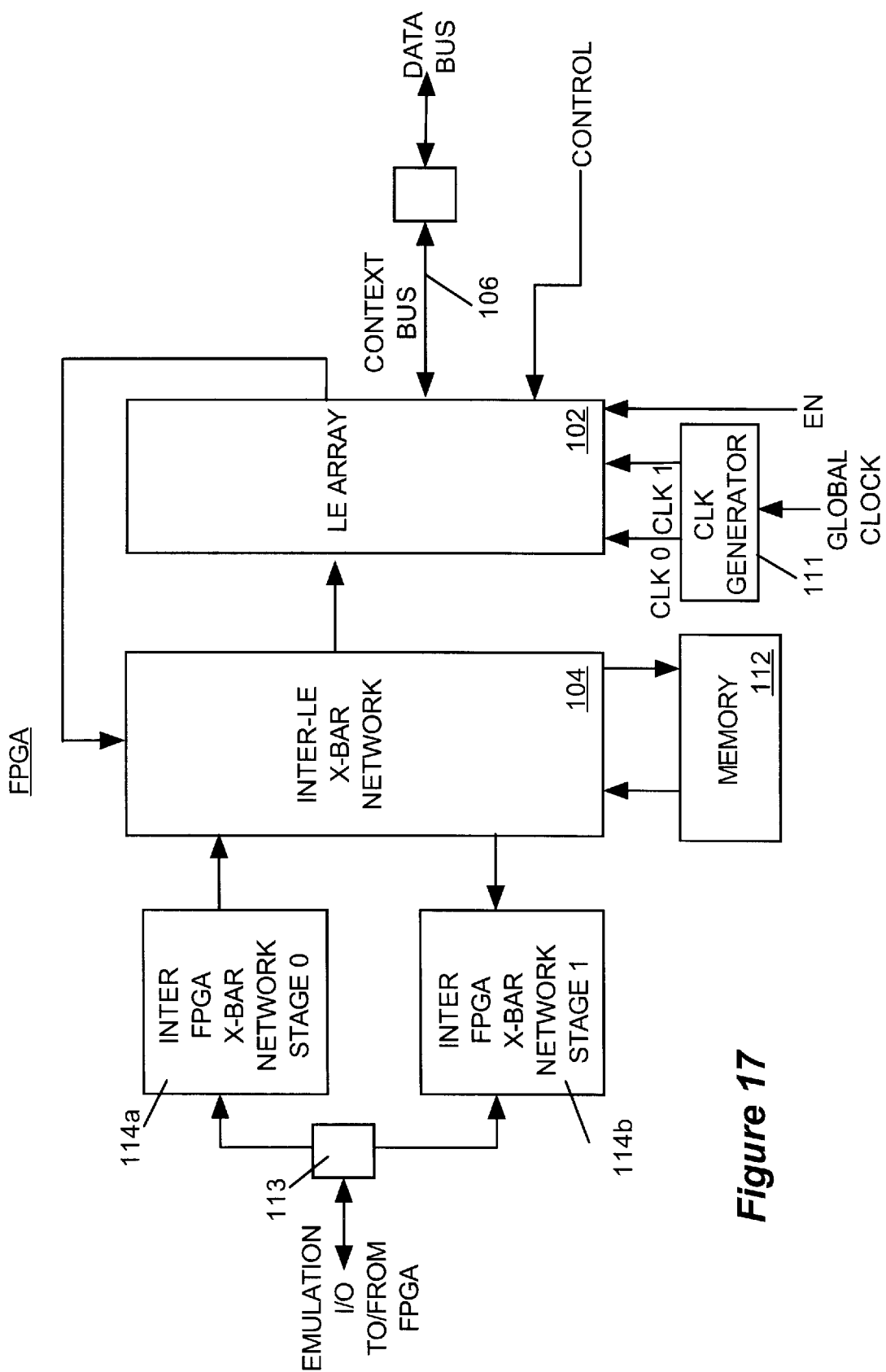

FIGS. 16–18 illustrates one embodiment of emulation array and interconnect networks 16 in further detail. Emulator array and interconnect networks 16 are distributively disposed on a number of logic boards 26, electrically connected to each other through an inter-logic board crossbar (x-bar) network (not shown) disposed in backplane (not shown), forming a single crate (not shown). In one embodiment, a crate includes six logic boards 26. As shown in FIGS. 16–17, each logic board 26 comprises a plurality of FPGAs 30 and inter-FPGA x-bar network (stage 1) 32 coupled to each other. For the illustrated embodiment, FPGAs 30 includes 24 FPGAs 100, and inter-FPGA x-bar stage 1 32 also "doubles" as inter-logic board x-bar network stage 0, thereby requiring only inter-logic board x-bar network stage 1 (not shown) to be disposed on backplane. As shown in FIG. 17, each FPGA 100 includes LE array 102 having multiple reconfigurable LEs, inter-LE crossbar (or x-bar) network 104, and I/O pins 113. For the illustrated embodiment, each FPGA 100 has 64 I/O pins 113. Each of I/O pins 113 can be statically configured to be either an input or an output pin. This static configuration can be accomplished in any of a wide variety of conventional manners, such as by way of a configuration register. Additionally, each FPGA 100 also includes inter-FPGA x-bar network (stage 0) 114a–114b. In other words, inter-FPGA x-bar network (stage 0) 114a–114b is actually distributively disposed on-chip inside each FPGA 100.

As in the prior art, LEs 102 are used to emulate circuit elements of a circuit design to be "realized" for emulation. Inter-LE x-bar network 104 interconnects the LEs within a single FPGA 100 and the I/O pins of the FPGA 100. Inter-FPGA x-bar network stages 0 and 1 114a–114b and 32 in turn interconnect FPGAs 30 of a logic board 26 to each other, and to the logic board's interconnections to backplane 28. In other words, LEs 102 are interconnected with a scalable multi-level multi-stage x-bar network topology. This interconnection topology is described in detail in copending application, Ser. No. 08/542,519, entitled "An Emulation System Employing A Multi-Level Multi-Stage Network Topology For Interconnecting Reconfigurable Logic Elements", assigned to the assignee with the present invention, which is hereby fully incorporated by reference.

Preferably, as shown for the the illustrated embodiment, FPGA 100 also includes memory 112 and context bus 106. Memory 112 facilitates usage of FPGA 100 to emulate circuit design with memory elements. For the illustrated embodiment, memory 112 uses 8-bit input and 8-bit output. Context bus 106 facilitie individual initialization and observation of the LEs. An FPGA 100 including these and other useful debugging features is disclosed in copending application, Ser. No. 08/542,830, entitled "A Field Programmable Gate Array with Integrated Debugging Facilities", assigned to the assignee of the present invention, which is also hereby fully incorporated by reference.

Each FPGA 100 of FPGAs 30 is provided with a global clock signal, i.e. the same clock signal for all logic boards 26, and an enable signal (EN). Furthermore, each FPGA 100 further includes a clock generator 111 for generating at least an emulation clock (Clk0) and a "doubled" (or x2) clock (Clk1) for the LE array 102, using the provided global clock.

FIG. 18 illustrates one embodiment of LEs 102 in further detail. As shown, for the illustrated embodiment, each LEs 102 include 128 reconfigurable LEs 200. Each reconfigurable LE 200 includes a multiple input—single output truth table 202, a pair of master-slave latches 204–206, output multiplexor 208, input multiplexor 212, control logic 214, and clock signal generation circuitry 230. The enumerated elements are coupled to each other as shown.

Truth table 202 is used to generate a predetermined output in response to a set of inputs. For the illustrated embodiment, truth-table 202 has 4 inputs and 1 output. In other words, depending on the inputs, truth table 202 outputs 1 of $2^4$ of predetermined outputs. Each of master-slave latches 204–206 is used to store an input value synchronously with its clock input. Furthermore, each of master-slave latches 204–206 can be asynchronously forced to one or zero depending on the values of set and reset. For the illustrated embodiment, the set and reset inputs are provided using the inputs 13 and 12 of truth table 202.

Output multiplexor 208, input multiplexor 210 and control logic 212 are used to control the manner in which truth table 202 and master-slave latches 204–206 are used. Output multiplexor 208 allows either the output of truth table 202 (by-passing master-slave latches 204–206) or the output of slave latch 206 (for level sensitive designs), or the output of master latch 204 (for edge sensitive designs) to be selected for output. The by-passed output is selected if truth table 202 is to be used standalone. When either the output of master or slave latch 204 or 206 is selected, input multiplexor 210 allows either the output of truth table 202, the feedback from output multiplexor 208, or an input value on context bus 106 to be provided to master-slave latches 204–206. The feedback value is selected to "freeze" LE 200, and the bus value is selected to initialize LE 200. Thus, master/slave latches 204–206 operating in conjunction with multiplexor 210 may be configured to function as illustrated in FIG. 6b.

Control logic 212 controls input multiplexor 210 and the set and reset values provided to master-slave latches 204–206, in accordance to a set, a reset, an ENAB, a load (LDE) and a hold (HLD) value provided. Clock signal generation circuitry 230 is used to selectively provide one of a number of clock signals for master-slave latches 204–206. Clock signal generation circuitry 230 generates the localized clock signal using selected ones of Clk0, Clk1, and a calculated clock from I0. In other words, the localized clock signals provided to master-slave latches 204–206 are generated by circuitry integrated with each LE 200 using inputs generated by the "on-chip" clock generator 111 or other LEs.

Furthermore, the inter-board, inter-FPGA, and inter-LE clock skew is ensured to be smaller than the minimum propagation time between any two registers in emulation array and interconnect network 16. Hence, there is no race conditions (short paths) between registers clocked by such signals. Lastly, LE 200 also includes buffer 214a for outputting the selected output to inter-LE X-bar network 104 and buffer 214b for outputting the selected output onto context bus 106 for direct observation outside FPGA 100.

In sum, truth table 202 may be used in a standalone manner, or in conjunction with the corresponding master-slave latches 204–206. Enhanced LE 200 is suitable for "level sensitive" as well as "edge sensitive" circuit design emulations. Additionally, beside the "normal" current output of truth table 202, each LE 200 can be individually initialized. Each LE 200 can also be caused to output the same output over and over again, as if it is frozen. Furthermore, LEs 200 are individually and directly observable outside FPGA 100. In other words, there are no "hidden nodes". The state of each "node" is directly observable outside the FPGA, without, requiring the reconfiguration and time consuming re-compilation of circuit design mappings normally performed under the prior art.

Thus, a method and apparatus for removing timing hazards in a circuit design has been described. While the method and apparatus of the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. An apparatus comprising:

an execution unit for executing programs; a storage unit coupled to said execution unit, and having stored therein a program for execution by said execution unit during operation, wherein when executing, the program enables the apparatus to identify certain storage circuit elements in a circuit design, said certain storage circuit elements being controlled by synchronization signals that can cause timing hazards by virtue of these synchronization signals' potential skews with respect to a reference signal of the circuit design not being ensured to be within a design tolerance limit, the synchronization signals being generated by either gating or dividing combinatorial logic based on at least the reference signal;

the program further enables the apparatus to automatically transform said certain storage circuit elements to be controlled by synchronization signals that do not have potential skews with respect to the reference signal not being ensured to be within the design tolerance limit, without altering functionality of the circuit design, thereby removing the timing hazards that can be caused, the program first transforming the storage circuit elements controlled by synchronization signals generated by gating combinatorial logic, then organizing remaining ones of said storage circuit elements controlled by synchronization signals generated by dividing combinatorial logic into logical levels, and transforming said remaining ones of the storage circuit elements recursively, one logical level at a time.

2. The apparatus as set forth in claim 1, wherein the apparatus is enabled by the program to automatically transform said certain storage circuit elements controlled by the gated synchronization signals to be controlled by either the reference signal, a constant signal or a divided version of the reference signal multiplied by two, in conjunction with a complementary enable control signal, if appropriate.

3. The apparatus as set forth in claim 2, wherein the apparatus is enabled by the program to determine the appropriate transformation for one of said storage circuit elements controlled by a gated synchronization signal, using a boolean function corresponding to the gating combinatorial logic, and factoring into consideration whether the pre-transformation storage circuit element has an enable control signal or not.

4. The apparatus of claim 3, wherein the apparatus is enabled by the program to determine the employment of the reference signal, the constant signal or the divided version of the reference signal multiplied by two, and the employment of the complementary enable signal by determining at least a first and a second co-factor value of a logical decomposition of the synchronization signal using the corresponding boolean function.

5. The apparatus as set forth in claim 4, wherein the apparatus is enabled by the program to construct each of the boolean functions using a reduced order binary decision diagram.

6. The apparatus as set forth in claim 4, wherein the apparatus is also enabled by the program to insert an AND gate into the circuit design to qualify a complementary enable signal, if employed and the pre-transformation storage circuit element has an enable control signal.

7. The apparatus as set forth in claim 1, wherein the apparatus is enabled by the program to insert a replicate of the dividing combinatorial logic of the divided synchronous signal of a storage circuit element into the circuit design to generate a predictive version of the divided synchronous signal.

8. The apparatus as set forth in claim 7, wherein the apparatus is also enabled by the program to insert a first AND gate in the circuit design to generate a logical AND of an inverted version of the divided synchronous signal and the predictive version of the divided synchronous signal.

9. The apparatus as set forth in claim 8, wherein the apparatus is also enabled by the program to provide the output of the first AND gate as the complementary enable control signal if the storage circuit element does not have an enable signal.

10. The apparatus as set forth in claim 8, wherein the apparatus is also enabled by the program to insert a second AND gate in the circuit design to qualify the output of the first AND gate by an enable signal of the storage circuit element, and then providing the qualified output as the complementary enable control signal, if the storage circuit element has such an enable signal.

11. The apparatus as set forth in claim 7, wherein the apparatus is also enabled by the program to insert for each outputting flip-flop providing input to the dividing combinatorial logic and having an enable signal, a multiplexor to provide a selected one of a current state or a next state of the outputting flip-flop's output to the replicated dividing combinatorial logic as input, the multiplexor being controlled by the enable signal of the outputting flip-flop.

12. An automated method for removing timing hazards from a circuit design; said method comprising the steps of:

a) identifying first storage circuit elements controlled by synchronization signals that are generated by gating combinatorial logic based on at least a reference signal of the circuit design;

b) automatically transforming each of said first storage circuit elements controlled by the gated synchronization signals to be controlled by either the reference signal, a constant signal or a divided version of the reference signal multiplied by two, in conjunction with a complementary enable control signal, if appropriate;

c) identifying second storage circuit elements controlled by synchronization signals that are generated by dividing combinatorial logic based on at least the reference signals, and logically organize said second storage circuit elements into logic levels; and d) automatically transforming each of said second storage circuit elements controlled by the divided synchronization signals to be controlled by the reference signal, in conjunction with a complementary enable control signal recursively, one logical level at a time.

13. The method as set forth in claim 12, wherein said step (b) includes determining the appropriate transformation to be performed for each of said first storage circuit elements using a boolean function corresponding to the gating combinatorial logic, and factoring into consideration whether the pre-transformation storage circuit element has an enable control signal or not.

14. The method as set forth in claim 13, wherein said determination includes determining the employment of the reference signal, the constant signal or the divided version of the reference signal multiplied by two, and the employment of the complementary enable signal, by determining a first and a second co-factor value of a logical decomposition of the gated synchronization signal using the boolean function.

15. The method as set forth in claim 14, wherein said step (b) further includes constructing the boolean function using a reduced order binary decision diagram.

16. The method as set forth in claim 14, wherein said step (b) further includes inserting an AND gate into the circuit design to qualify the complementary enable signal, if employed and the pre-transformation storage circuit element has an enable control signal.

17. The method as set forth in claim 12, wherein at each iteration, said step (d) includes inserting a replicate of the dividing combinatorial logic of the divided synchronous signal of one of second storage circuit elements into the circuit design to generate a predictive version of the divided synchronous signal.

18. The method as set forth in claim 17, wherein step (d) further includes inserting a first AND gate in the circuit design to generate a logical AND of an inverted version of the divided synchronous signal and the predictive version of the divided synchronous signal.

19. The method as set forth in claim 18, wherein the step (d) further includes providing the output of the first AND gate as the complementary enable control signal if the storage circuit element does not have an enable signal.

20. The method as set forth in claim 18, wherein step (d) further includes inserting a second AND gate in the circuit design to qualify the output of the first AND gate by an enable signal of the storage circuit element, and then providing the qualified output as the complementary enable control signal, if the storage circuit element has such an enable signal.

21. The method as set forth in claim 17, wherein step (d) further includes inserting for each outputting flip-flop providing input to the dividing combinatorial logic and having an enable signal, a multiplexor to provide a selected one of a current state or a next state of the outputting flip-flop's output to the replicated dividing combinatorial logic as input, the multiplexor being controlled by the enable signal of the outputting flip-flop.

22. A computer system comprising:

an execution unit for executing programs;

a storage unit coupled to said execution unit, and having stored therein a program for execution by said execution unit during operation, wherein when executing, the program enables the computer system to identify certain storage circuit elements in a circuit design, said certain storage circuit elements being controlled by synchronization signals that can cause timing hazards by virtue of these synchronization signals' potential skews with respect to a reference signal of the circuit design not being ensured to be within a design tolerance limit, the synchronization signals being generated by either gating or dividing combinatorial logic based on at least the reference signal;

the program further enables the computer system to automatically transform said certain storage circuit elements to be controlled by synchronization signals that do not have potential skews with respect to the reference signal not being ensured to be within the design tolerance limit, without altering functionality of the circuit design, thereby removing the timing hazards that can be caused, the program first transforming the storage circuit elements controlled by synchronization signals generated by gating combinatorial logic, then organizing the remaining ones of the storage circuit elements controlled by synchronization signals generated by dividing combinatorial logic into logical levels, and transforming the remaining ones of the storage circuit elements recursively, one logical level at a time.

23. A hardware emulation system comprising:

a host system having an execution unit for executing programs, and a storage unit coupled to said execution unit, and having stored therein a program for execution by said execution unit during operation, wherein when executing, the program enables the host system to map a circuit design onto logic and interconnect elements of the hardware emulation, including identification of certain storage circuit elements in the circuit design, said certain storage circuit elements being controlled by synchronization signals that can cause timing hazards by virtue of these synchronization signals' potential skews with respect to a reference signal of the circuit design not being ensured to be within a design tolerance limit, the synchronization signals being generated by either gating or dividing combinatorial logic based on at least the reference signal, the program further enables the host system to automatically transform said certain storage circuit elements to be controlled by synchronization signals that do not have potential skews with respect to the reference signal not being ensured to be within the design tolerance limit, without altering functionality of the circuit design, thereby removing the timing hazards that can be caused, the program first transforming the storage circuit elements controlled by synchronization signals generated by gating combinatorial logic, then organizing the remaining ones of the storage circuit elements controlled by synchronization signals generated by dividing combinatorial logic into logical levels, and transforming the remaining ones of the storage circuit elements recursively, one logical level at a time; and said logic and interconnect elements for emulating said circuit design.

* * * * *